(12) United States Patent
Forte et al.

(10) Patent No.: US 8,994,565 B2
(45) Date of Patent: Mar. 31, 2015

(54) ANALOG TO DIGITAL CONVERSION APPARATUS WITH A REDUCED NUMBER OF ADCS

(71) Applicant: STMicroelectronics, Srl., Agrate Brianza (MB) (IT)

(72) Inventors: Gianluigi Forte, Camporotondo Etneo (IT); Dino Costanzo, Catania (IT); StelloMatteo Bille', Catania (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 24 days.

(21) Appl. No.: 14/055,874

(22) Filed: Oct. 16, 2013

(65) Prior Publication Data
US 2014/0043180 A1  Feb. 13, 2014

Related U.S. Application Data

(63) Continuation of application No. 13/440,785, filed on Apr. 5, 2012, now Pat. No. 8,564,465.

(30) Foreign Application Priority Data

May 24, 2011 (IT) .............................. MI2011A0925

(51) Int. Cl.
*H03M 1/00* (2006.01)
*H03M 1/12* (2006.01)

(52) U.S. Cl.
CPC ................................. *H03M 1/122* (2013.01)
USPC ............ 341/141; 345/173; 345/96; 345/589; 375/355; 375/373; 375/327; 375/294; 327/147; 327/148; 327/157; 327/45; 341/140; 341/155

(58) Field of Classification Search
CPC ... H03M 1/122; H03M 1/0668; H03M 1/361; H03M 1/74; H03M 3/50; H03M 3/464; H03L 7/07; H03L 7/40; H03L 7/0337; G09G 3/3688

USPC ................... 341/130–160; 345/96, 173, 589; 375/294, 355, 373, 327; 327/147, 148, 327/157, 45
See application file for complete search history.

(56) References Cited

U.S. PATENT DOCUMENTS 5,093,750 A * 3/1992 Park et al. ..................... 386/327
5,168,276 A   12/1992 Huston et al.
(Continued)

OTHER PUBLICATIONS

IT Search Report; Application No. IT MI20110925; dated Jan. 30, 2012; pp. 10.
(Continued)

*Primary Examiner* — Lam T Mai
(74) *Attorney, Agent, or Firm* — Allen, Dyer, Doppelt, Milbrath & Gilchrist, P.A.

(57) ABSTRACT

An analog to digital conversion includes a multiplexor circuit for receiving analog input signals and, responsive to a select input, an analog to digital converter circuit to convert a selected analog signal into a digital signal, a conversion starting device to send a conversion start signal on the basis of a trigger event, the conversion starting device being responsive to a select input, a sequencer to control the analog to digital converter circuitry to execute one sequence conversion on the basis of one conversion sequence instruction, and a FIFO register block to receive conversion sequence instructions and being able to queue each new received conversion sequence instruction if an actual conversion sequence is in progress and to control the sequencer to execute a new sequence conversion instruction after the conversion sequence is executed.

10 Claims, 4 Drawing Sheets

(56) References Cited

U.S. PATENT DOCUMENTS

| | | | |
|---|---|---|---|
| 5,832,255 A * | 11/1998 | Roberts et al. | 713/500 |
| 6,020,734 A * | 2/2000 | Grisham et al. | 324/103 R |
| 6,043,810 A * | 3/2000 | Kim et al. | 345/173 |
| 6,459,426 B1 | 10/2002 | Eglit et al. | |
| 6,486,809 B1 | 11/2002 | Figoli | |
| 7,193,549 B1 * | 3/2007 | Nanda et al. | 341/144 |
| 7,280,115 B2 * | 10/2007 | Wang et al. | 345/589 |
| 7,307,450 B2 * | 12/2007 | Liang et al. | 326/39 |
| 7,446,679 B1 * | 11/2008 | Han | 341/51 |
| 7,688,912 B2 | 3/2010 | Albulet | |
| 8,306,147 B2 * | 11/2012 | Hsu | 375/294 |
| 8,411,707 B2 | 4/2013 | Molina et al. | |
| 8,564,465 B2 * | 10/2013 | Forte et al. | 341/141 |

OTHER PUBLICATIONS

IT Office Action; Application No. MI2011A000925; dated Feb. 8, 2012; p. 1.

International Search Report; International Application No. PCT/US2006/062461; Apr. 27, 2007; pp. 2.

\* cited by examiner

ANALOG TO DIGITAL CONVERSION APPARATUS WITH A REDUCED NUMBER OF ADCS

RELATED APPLICATION

The present invention is a continuation of co-pending U.S. patent application Ser. No. 13/440,785 filed Apr. 5, 2012, which claims priority of Italian Application No. MI2011A000925 filed May 24, 2011, both of which applications are incorporated herein by this reference in their entireties.

BACKGROUND OF THE INVENTION

The present invention relates to an analog to digital converter apparatus.

Analog to digital converters (ADCs) are well known in the art and are commonly used to convert an analog signal into a digital representation by periodically sampling the analog signal to form a sequence of digital values. A simple ADC generally provides a low resolution digital representation for each sample, such as an eight bit value, for example. More complex ADCs provide higher accuracy values, such as a sixteen bit value. ADCs can belong to a single apparatus including a microprocessor adapted to control the operations of the ADC by means of software executed on it.

The need for ADCs is rapidly increased in modern electronic applications especially in motor control devices; the number of available ADCs may be lower than the number required.

Also, the available ADCs must be managed on the basis of a priority request.

SUMMARY OF THE INVENTION

In view of the state of the art, the objective of the present invention is to provide an analog to digital conversion apparatus which allows a reduction in the number of ADCs and management of the different conversion sequence requirements without the intervention of a microprocessor.

According to the present invention, this objective is achieved by means of an analog to digital conversion apparatus comprising:

an input multiplexor circuit having a plurality of analog input terminals for receiving a plurality of analog input signals, said input multiplexor circuit being responsive to a selected input, an analog to digital conversion circuitry adapted to convert the selected analog signal into a digital signal, a conversion starting device adapted to send to said analog to digital converter circuitry a conversion start signal on the basis of a selected trigger event of a plurality of trigger events, the conversion starting device being responsive to at least one select input, a sequencer coupled to the select input of the input multiplexor circuit and to the at least one select input of the conversion starting device and adapted to control the analog to digital converter circuitry to execute one sequence conversion on the basis of one conversion sequence instruction, a ("FIFO") register block adapted to receive a plurality of conversion sequence instructions and being able to queue each new received conversion sequence instruction if an actual conversion sequence is in progress and is adapted to control the sequencer to execute a new sequence conversion instruction after the actual conversion sequence is completely executed.

BRIEF DESCRIPTION OF THE DRAWINGS

The features and advantages of the present invention will become apparent from the following detailed description of one embodiment thereof, illustrated only by way of non-limitative example in the annexed drawings, in which.

DETAILED DESCRIPTION

Figure 1:
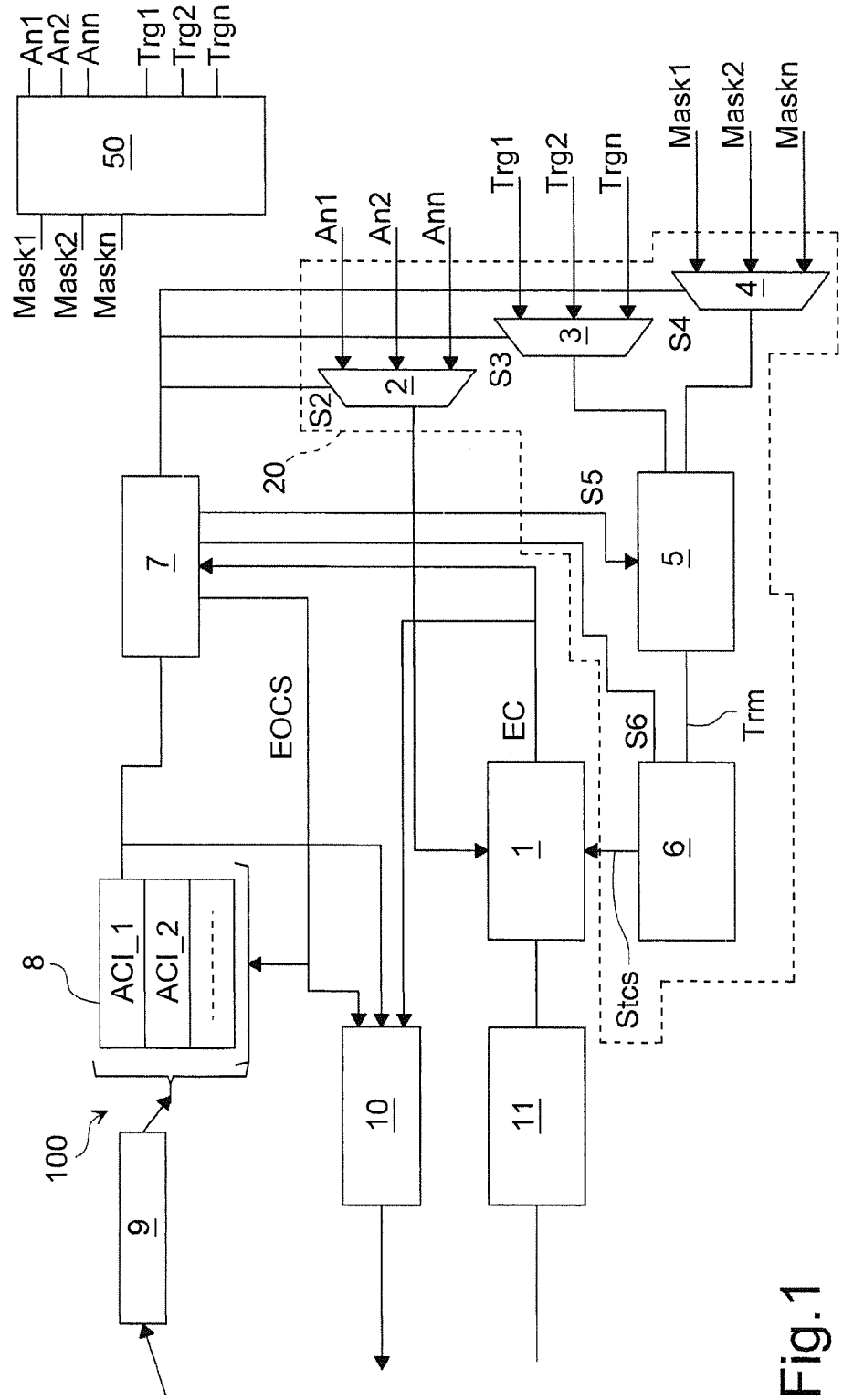
FIG. 1 shows a schematic of an analog to digital conversion apparatus according to the present invention.

FIG. 1 shows a schematic of an analog to digital conversion apparatus 100 according to the present invention. The apparatus comprises an ADC circuitry 1 able to convert an analog signal into an equivalent digital representation of the analog signal; the analog signal to be converted deriving from an input multiplexor circuit 2 having a plurality of analog input terminals An1, An2 . . . Ann for receiving a respective plurality of analog input signals and said input multiplexor circuit is responsive to a select input S2. The analog input signals can be either internally generated from a microcontroller 50 or provided from other external devices.

The apparatus comprises a conversion starting device 20 adapted to send to said analog to digital converter circuitry 1 a conversion start signal Stcs on the basis of a selected trigger event of a plurality of trigger events E1, E2, . . . Ep, (not shown) with p greater than n; the conversion starting device is responsive to select inputs S3-S6.

Preferably the conversion starting device 20 comprises a trigger multiplexor circuit 3 having a plurality of input terminals for receiving respective triggering signals Trg1 . . . Trgn and a mask multiplexor circuit 4 having a plurality of input terminals for receiving respective masking signals Mask1 . . . Maskn; the multiplexor circuits 3 and 4 responsive to respective select inputs S3 and S4. One of the triggering signals and one of the masking signals are then fed to a logic operator block 5, belonging to the conversion starting device 20, able to operate simple logic operations (such as AND, OR, XOR, . . . ) on the two signals deriving from the multiplexor circuits 3 and 4; the logic operator block is responsive to a select input S5 and outputs a signal Trm. The output signal Trm is then fed to the polarity selection block 6, belonging to the conversion starting device 20, able to generate the conversion start signal Stcs in response to the selected sensitivity, that is on the basis of the rising or falling edge and/or to low or high logic level of the signal Trm; the polarity selection block is responsive to a select input S6.

The triggering signals Trg1 . . . Trgn and the masking signals Mask1 . . . Maskn can be either generated internally to the microcontroller 50 (for instance from some peripherals such as timers) or provided from the external device (for instance through a dedicated microcontroller pin).

The apparatus 100 comprises a sequencer or sequence handler block 7 coupled to the select input S2 of the input multiplexor circuit 2 and to the select inputs S3-S6 of the conversion starting device 20 and adapted to control the analog to digital converter circuitry 1 to execute a conversion sequence on the basis of one conversion sequence instruction or auto-configuring instruction ACI_1, ACI_2 . . . ACI_n, (Ann).

The apparatus further comprises a FIFO register block 8 able to manage the conversion process of the conversion apparatus. The FIFO register is updated once the conversion sequence is finished by means of a signal EOCS (End Of Conversion Sequence); the FIFO block defines the new conversion sequence to be carried out.

The FIFO register block 8 receives the auto-configuring instructions ACI_1, ACI_2 . . . ACI_n, preferably one successive to the other along the time, from the sequence instruction register 9 which can be programmed from the microcontroller 50 or from another external entity such as ("DMA") transactions. As soon as the register 9 is programmed, the apparatus automatically loads the sequence instruction or auto-configuring instructions ACI_1, ACI_2 . . . ACI_n into the FIFO register block 8 and clears the sequence instruction register content. The FIFO register block 8 is able to manage the different auto-configuring instructions ACI_1, ACI_2 . . . ACI_n at the input, even when said auto-configuring instructions are received a short time one from the other; in fact the FIFO block provides to queue the other auto-configuring instructions when one auto-configuring instruction is not carried out, that is the conversion sequence has not been completely carried out by analog to digital conversion circuitry 1. That is the FIFO register block 8, in the case wherein the second auto-configuring instruction ACI_2 or more auto-configuring instructions ACI_2, ACI_3 . . . ACI_n are received in a short time, before the execution of first auto-configuring instruction ACI_1 is ended, waits for the end of the execution of the first auto-configuring instruction ACI_1 for the execution of the next auto-configuring instruction ACI_2. Therefore, the analog to digital converter apparatus, according to the present invention, differs from the prior art, and is able to manage the different conversion requirements deriving from the outside when said requirements arrive in a short time the one from the other.

When a first sequence instruction (or auto-configuring instruction) ACI_1 is loaded in the FIFO register block 8, said instruction is transferred to the sequence handler block 7 and executed. The sequence handler block 7 configures the apparatus by selecting:

- which of the available analog signals An1 . . . Ann is to be converted (optionally a specific sampling time could also be associated to each of the analog inputs);
- which of the available triggering signals Trg1 . . . Trgn and masking signals Mask1 . . . Maskn should be fed to the logic operator block 5;
- which logic operation should be executed on the two signals by the logic operator block 5 (e.g. Trg4 AND Mask2, Trg4 NOT Mask2);
- what is the sensitivity of polarity selection block 6, that is if the block 6 should be sensitive to the rising/falling edges or the high/low levels of the signal Trm at the input.

Sequence handler block 7 controls the conversion starting device 20 and configures it to determine the event E1, E2 . . . En for the start of the conversion.

For each sequence instruction ACI_1 . . . ACI_n the triggering signal and/or the masking signal and/or the logic operation and/or the sensitivity of the polarity selection block can be different from those of another sequence instruction. Also the triggering signal and/or the masking signal and/or the logic operation and/or the sensitivity of the polarity selection block can vary inside each conversion sequence, that is the sequence handler block 7 can select different triggering signals and/or masking signals and/or logic operations and/or sensitivity of the polarity selection block for each conversion sequence on the basis of the auto-configuring instructions ACI_1, ACI_2 . . . ACI_n received from the FIFO register block 8.

Also the sequence handler block 7 can select different triggering signals and/or masking signals and/or logic operations and/or sensitivity of the polarity selection block for each single conversion belonging to the conversion sequence of the auto-configuring instructions ACI_1, ACI_2 . . . ACI_n received from the FIFO register block 8.

Once the single conversion of the conversion sequence has been executed, the ADC circuitry 1 feeds back this information to the sequence handler block 7 through the end of conversion signal EC. If the just performed single conversion was the last of the sequence, then the sequence is finished: the FIFO and the flag register 10, that is the end of conversion sequence register, are updated by means of the end of conversion sequence signal EOCS deriving from the sequence handler block 7; otherwise the sequence handler block 7 configures the apparatus so as to execute the next single conversion of the sequence.

Therefore, the FIFO register block 8 sends the next auto-configuring instruction to the sequence handler block 7 when the first auto-configuring instruction has been executed.

Figure 2:
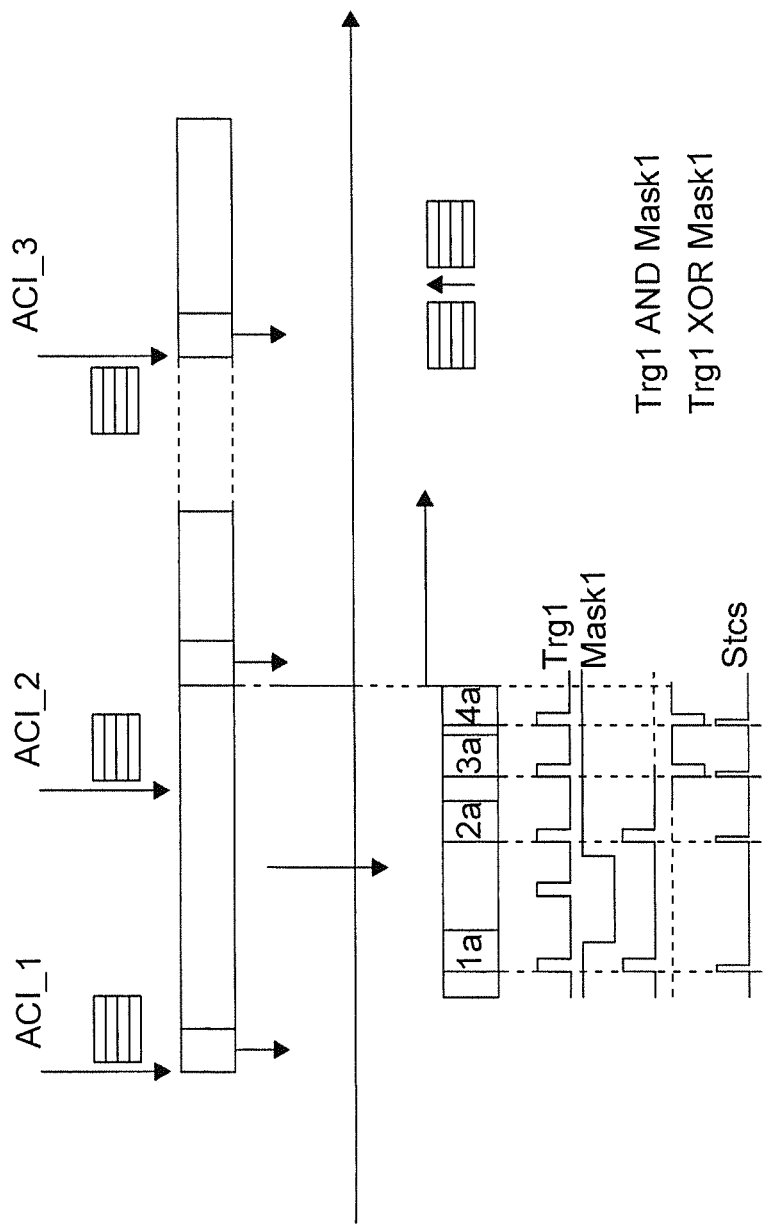
FIG. 2 is a time diagram of one conversion carried out by the apparatus according to the present invention.

FIG. 2 shows in more detail an example of the conversion process of the apparatus in FIG. 1. When a first auto configuring instruction ACI_1 is received and loaded in the FIFO register block 8, said instruction is executed by the sequence handler block 7; the last starts the first conversion sequence, for example a sequence composed by four conversions 1a, 2a, 3a, 4a. In FIG. 2 it is assumed that for conversions 1a and 2a, the logic operator block 5 operates as an 'AND' gate and the polarity selection block 6 is set by the sequence handler block 7 to be sensitive to the rising edge of the input signal Trm while for conversions 3a and 4a, the logic operator block 5 operates as a XOR gate and the polarity selection block 6 is set by the sequence handler block 7 to be sensitive to the falling edge of the input signal Trm. Moreover, in FIG. 2 it is assumed that the triggering signal and the masking signal are always the same for each of the conversions composing the sequences, in this case the signals Trg1 and Mask1 are selected. Each one of the conversions 1a and 2a starts when the signal Trm has a rising edge, which corresponds to the event E1, while each one of the conversions 3a and 4a starts when the signal Trm has a falling edge (corresponding to the event E2), and the conversion start signal Stcs being generated accordingly. After each conversion is finished, the data is written in the output registers 11 and the sequence handler block 7 is informed through the end of conversion signal EC. If the conversion sequence is finished, the sequence handler block 7 updates the FIFO register block 8 by means of a end of conversion sequence signal EOCS, by deleting the first ACI instruction and shifting up the FIFO elements. If after shifting the first element of the FIFO block is not null, a next ACI instruction is executed by the sequence handler block 7.

Flag register 10 stores event occurrence information such as EC, EOCS, FIFO underflow (FIFO empty), FIFO overflow, etc.

Figure 3:
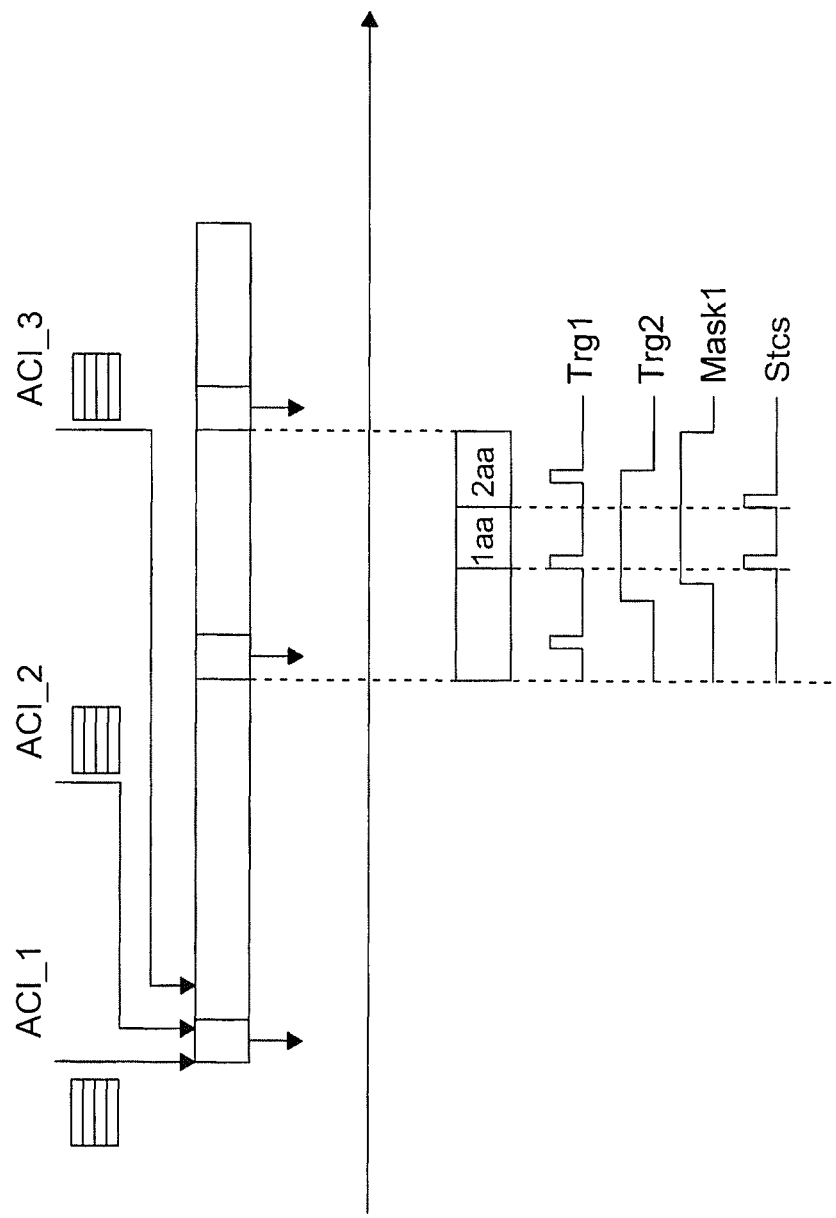
FIG. 3 is a time diagram of another conversion carried out by the apparatus according to the present invention.

Another example of the conversion process of the apparatus in FIG. 1 is provided in FIG. 3. When the sequence instruction register 9 is written three consecutive times, that is it contains three auto-configuring instructions ACI_1, ACI_2, ACI_3, the FIFO register block 8 receives the auto-configuring instructions ACI_1, ACI_2, ACI_3 from the sequence instruction register 9. As soon as the first instruction ACI_1 is written in the FIFO, the first sequence starts while the other two sequence instructions are queued in the FIFO. At the end of the first sequence execution, the FIFO is updated and the second instruction ACI_2 is executed. In the example provided, the second sequence is constituted by two conversions, 1aa and 2aa, and it is assumed that for conversion 1aa and 2aa that the logic operator block 5 operates as an 'AND' gate and the polarity selection block 6 is set by the sequence handler block 7 to be sensitive to the rising edge of the input signal Trm. The conditions for starting the conversion are always updated as soon as the conversion ends; in this case the polarity selection block 6 is configured to be sensitive to the rising edge (Trg1 AND Mask1) for the first conversion 1aa (event E1) and to the rising edge (Trg2 AND Mask1) for the second conversion 2aa.

After the second sequence has been completed, the third one is executed. At the end of the third sequence, the FIFO is empty and the FIFO underflow flag is raised in the flag register 10.

Figure 4:
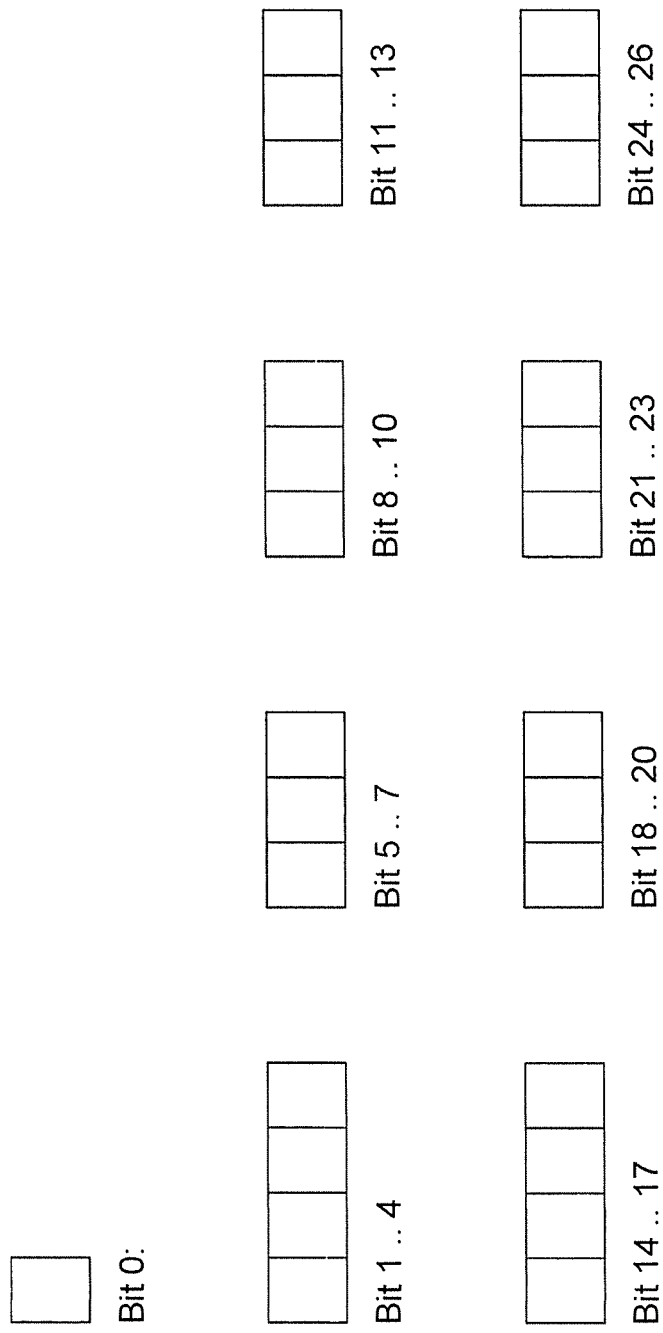
FIG. 4 shows one example of auto-configuring sequence instruction for the FIFO block of the apparatus in FIG. 1.

FIG. 4 shows an example of auto configuring sequence instructions ACI_1, ACI_2 . . . ACI_n. In this very simple example the number of conversions composing the sequence is set equal to 2 (Bit 0), the maximum number of analog inputs is 16 (Bit 1-4 and bit 14-17), the maximum number of the triggering signals is 8 (Bit 5-7 and bit 18-20), the maximum number of the masking signals is equal to 8 (Bit 8-10 and bit 21-23) while the maximum number of logic operations (AND, OR, XOR, NOT or combinations thereof) is 8 (Bit 11-13 and bit 24-26).

The analog to digital converter apparatus 100 in FIG. 1 may belong to a system provided with the microcontroller 50 coupled by means of a bus line to the analog to digital converter apparatus.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:

1. An analog to digital conversion apparatus comprising:
    a first multiplexor circuit for receiving a plurality of analog signals;
    a second multiplexor circuit for receiving a plurality of triggering signals;
    a third multiplexor circuit for receiving a plurality of masking signals;
    an analog to digital converter circuit for receiving an analog signal from an output of the first multiplexor, and for providing a digital output signal;
    a logic circuit coupled to outputs of the second multiplexor and third multiplexors and to the analog to digital converter; and
    a sequencer coupled to the logic circuit and to the first, second, and third multiplexors.

2. The analog to digital conversion apparatus of claim 1 further comprising a FIFO register coupled to the sequencer.

3. The analog to digital conversion apparatus of claim 2 wherein the FIFO register comprises auto-configuring instructions.

4. The analog to digital conversion apparatus of claim 2 wherein a sequence instruction register is operatively coupled to the FIFO register.

5. The analog to digital conversion apparatus of claim 1 further comprising a flag register coupled to the sequencer.

6. The analog to digital conversion apparatus of claim 1 further comprising an output register coupled to the analog to digital converter circuit.

7. The analog to digital conversion apparatus of claim 1 wherein the logic circuit comprises a logic operator block.

8. The analog to digital conversion apparatus of claim 1 wherein the logic circuit comprises a polarity selection block.

9. The analog to digital conversion apparatus of claim 1 wherein the logic circuit comprises a logic operator block coupled to a polarity selection block.

10. The analog to digital conversion apparatus of claim 1 wherein the logic circuit is configured to generate a start conversion signal for the analog to digital convertor circuit.

* * * * *